United States Patent
Kim et al.

(10) Patent No.: US 7,557,512 B2
(45) Date of Patent: Jul. 7, 2009

(54) ORGANIC ELECTROLUMINESCENT DEVICE AND DRIVING APPARATUS

(75) Inventors: Myung Seop Kim, Seoul (KR); Jae Man Lee, Seoul (KR); Jae Woo Kyung, Seoul (KR); Sung Kab Kim, Seoul (KR); Young Soo Han, Seoul (KR); Hong Gyu Kim, Gyeonggi-do (KR); Jong Geun Yoon, Gyeonggi-do (KR); Joong Hwan Yang, Gyeonggi-do (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 11/000,009

(22) Filed: Dec. 1, 2004

(65) Prior Publication Data

US 2005/0116659 A1    Jun. 2, 2005

(30) Foreign Application Priority Data

Dec. 2, 2003    (KR)    ........................ 10-2003-0086839

(51) Int. Cl.
    *B32B 9/00* (2006.01)
(52) U.S. Cl. ................. 315/169.3; 315/169.4; 313/521; 313/463; 313/600; 257/40; 257/213
(58) Field of Classification Search ................. 313/491, 313/494, 498, 499, 504, 506–509, 521, 463, 313/600; 315/169.3, 169.4; 257/40, 213
    See application file for complete search history.

(56) References Cited

U.S. PATENT DOCUMENTS 5,739,552 A * 4/1998 Kimura et al. ................. 257/89
5,965,907 A * 10/1999 Huang et al. ................... 257/89
6,771,020 B1 * 8/2004 Wang ......................... 313/506

(Continued)

FOREIGN PATENT DOCUMENTS

EP    0 493 975 B1    8/1995

(Continued)

OTHER PUBLICATIONS

European Search Report dated Aug. 11, 2006.

(Continued)

*Primary Examiner*—Don Wong
*Assistant Examiner*—Binh V Ho
(74) *Attorney, Agent, or Firm*—Holland & Knight LLP

(57) ABSTRACT

Provided is an organic EL device having a lower power consumption and high performance and enabling to display separate pictures on bidirectional screens as well as to display the same picture on the bidirectional screens, and a driving apparatus thereof. The organic EL device includes: a first organic EL panel for a unidirectional display; and a second organic EL panel for a unidirectional display, each of the first and second organic EL panels having a substrate, a first electrode, an emitting layer and a second electrode, wherein the first organic EL panel and the second organic EL panel are coupled so as to display pictures in bidirections. According to the present invention, a sufficient brightness can be obtained even under a low power. Also, since an opaque cathode is used, performance and transmittance are enhanced compared with the related art organic EL device using a transparent cathode.

3 Claims, 8 Drawing Sheets

U.S. PATENT DOCUMENTS

| | | |
|---|---|---|
| 6,771,327 B2 * | 8/2004 | Sekiguchi ..................... 349/12 |
| 6,788,298 B2 * | 9/2004 | Kota et al. ................... 345/204 |
| 6,998,772 B2 * | 2/2006 | Terumoto ................... 313/504 |
| 7,158,161 B2 * | 1/2007 | Gyoutoku et al. ........... 347/130 |
| 2001/0050662 A1 * | 12/2001 | Kota et al. ..................... 345/76 |
| 2002/0044782 A1 * | 4/2002 | Kota et al. ................... 396/661 |
| 2002/0047963 A1 * | 4/2002 | Youn et al. ................... 349/110 |
| 2003/0132446 A1 * | 7/2003 | Guenther et al. ............... 257/88 |
| 2004/0056587 A1 * | 3/2004 | Kim ........................... 313/500 |
| 2004/0119407 A1 * | 6/2004 | Kim et al. ................... 313/512 |
| 2004/0212300 A1 * | 10/2004 | Chao et al. .................. 313/506 |
| 2005/0007517 A1 * | 1/2005 | Anandan ....................... 349/69 |
| 2006/0087224 A1 | 4/2006 | Oki et al. ................... 313/504 |

FOREIGN PATENT DOCUMENTS

| | | |
|---|---|---|
| EP | 1 071 313 B1 | 4/2005 |
| JP | 02-134696 U | 11/1990 |
| JP | 06-223966 | 8/1994 |
| JP | 06-223966 A | 8/1994 |
| JP | 11-190979 | 7/1999 |
| JP | 2000-058260 | 2/2000 |
| JP | 2000-100558 | 4/2000 |
| JP | 2000-100560 | 4/2000 |
| JP | 2001-345184 | 12/2001 |
| JP | 2002-313571 | 10/2002 |
| JP | 2003-066859 A | 3/2003 |
| JP | 2003-229252 A | 8/2003 |
| JP | 2003-317940 A | 11/2003 |
| JP | 2003-338366 | 11/2003 |
| JP | 2004-014316 | 1/2004 |
| JP | 2005-084642 | 3/2005 |
| JP | 2005-100928 | 4/2005 |
| KR | 10-2001-0016833 | 3/2001 |
| KR | 10-2003-0068654 A | 8/2003 |
| KR | 10-2005-0034878 | 4/2005 |
| WO | WO 03/092332 A1 | 6/2003 |

OTHER PUBLICATIONS

Japanese Office Action dated Jan. 10, 2007.

* cited by examiner

Copper(11) phthalocyanine(CuPc)

N,N'-diphenyl-N,N'-bis(3-methylphenyl)-(1,1'-biphenyl)-4,4'-diamine(TPD)

8-hydroxy quinoline aluminum(Alq$_3$)

4-4'-bis[N-(1-naphthyl)-N-phenyl-amino]biphenyl(NPD)

ORGANIC ELECTROLUMINESCENT DEVICE AND DRIVING APPARATUS

This application claims the benefit of the Korean Application No. 10-2003-0086839 filed on Dec. 2, 2003 which is hereby incorporated by reference.

BACKGROUND OF THE INVENTION

1. Field of the Invention

The present invention relates to an organic EL device, and more particularly, to an organic EL device and a driving apparatus thereof.

2. Discussion of the Related Art

Generally, an organic electroluminescent (EL) device is a device to emit light while a pair of electron and hole formed by injecting a charge into a light emitting layer of an organic material disposed between the electron injection electrode (cathode) and the hole injection electrode (anode).

Such an organic EL device is characterized by operation at a relatively low voltage and low power consumption.

Among the general organic EL devices, the organic EL devices for a unidirectional display can be classified into a bottom emission type and a top emission type.

A bottom emission type organic EL device is shown in FIG. 1. A method of fabricating the bottom emission type organic EL device shown in FIG. 1 will now be described.

An anode 2 is formed on a transparent substrate 1. The anode 2 is generally made of indium tin oxide (ITO).

Next, a hole injecting layer (HIL) 3 is formed on the anode 2. The HIL 3 is generally made of copper phthalocyanine (CuPc) and is coated to a thickness of 10-30 nm. The structure of CuPc is shown in FIG. 8 for your understanding.

Next, a hole transport layer (HTL) 4 is formed on the HIL 3.

The HTL is generally made of TPD (N'-diphenyl-N,N'-bis(3-methylphenyl)-(1-1'-biphenyl)4,4'-diamine) or NPD (4,4'-bis[N-(1-naphthyl)-N-phenyl-amino]biphenyl), and is deposited to a thickness of 30-60 nm. The structures of TPD and NPD are shown in FIG. 8 for your understanding.

Next, an organic emitting layer 5 made of an organic material is formed on the HTL 4.

The organic emitting layer 5 as formed may contain dopants if necessary.

In case of green light emission, $Alq_3$ {tris(8-hydroxyquinolate)aluminum} is deposited to about 30-60 nm so as to form the organic emitting layer 5, and coumarin 6 or Qd (Quinacridone) is added as the dopants.

In case of red light emission, ECM, DCJT, DCJTB or the like is used. The structure of $Alq_3$ is also shown in FIG. 8.

Next, an electron transport layer (ETL) 6 and an electron injecting layer (EIL) 7 are continuously formed on the organic emitting layer 5, or the ETL 6 and the EIL 7 are formed together with an electron injection transport layer.

At this time, the EIL 7 is formed by coating LiF or $Li_2O$ to a thickness of about 5□, or by depositing alkali metal or alkaline-earth metal such as Li, CA, Mg, Sm, etc. to a thickness less than 200□ for making electron injection better.

Also, in case of the green light emission, since Alq3 used as the organic emitting layer 5 has a good electron transport capability, the EIL 7 and the ETL 6 may be not used.

Next, aluminum (Al) is coated on the EIL 7 to a thickness of about 1000 □ to form a cathode 8.

In the bottom emission type organic EL device formed by the above method, the material layer used as the cathode serves as a mirror reflection surface.

Accordingly, half of the light emitting from the emitting layer of the organic EL device emits toward the transparent electrode (anode) 2.

The remaining half of the light is reflected by the cathode and emits toward the transparent electrode (anode).

Next, a top emission type organic EL device is shown in FIG. 2. A method of fabricating the top emission type organic EL device shown in FIG. 2 will now be described.

Unlike in the bottom emission type, in the bottom emission type, an organic EL device is formed on an opaque substrate and a transparent electrode is lastly formed such that light emits in an opposite direction to the substrate.

An anode 12 is first formed on an opaque substrate 11.

Next, hole injecting layers (HILs) 13 and 14 are formed on the anode 12.

Next, an organic emitting layer 15 made of an organic material is formed on the HTL 14.

Next, an electron transport layer (ETL) 16 and an electron injecting layer (EIL) 17 are formed on the organic emitting layer 15.

Next, a transparent cathode 18 is formed on the EIL 17 such that light is irradiated upward.

FIG. 3 is a sectional view of a bidirectional organic EL according to the related art.

The organic EL device for bidirectional display employs the bottom emission type shown in FIG. 1 at the lower side from an emitting layer 25 and the top emission type shown in FIG. 2 at the upper side from the emitting layer 25 such that light emits in both directions of upper and lower sides.

However, the related art organic EL device for bidirectional display has the following drawbacks.

First, since light generated by a single emitting layer emits in upper and lower directions, the organic EL device for bidirectional display needs a power at least four times greater than that of the bottom emission type organic EL device so as to obtain the same brightness.

Secondly, since the organic EL device for bidirectional display is driven by a pair of electrodes, it is possible to display an identical picture in the upper and lower directions, but it is impossible to display different pictures on the upper screen and the lower screen.

SUMMARY OF THE INVENTION

Accordingly, the present invention is directed to an organic EL device and a driving apparatus thereof that substantially obviate one or more problems due to limitations and disadvantages of the related art.

An object of the present invention is to provide an organic EL device having a lower power consumption and high performance and enabling to display separate pictures on bidirectional screens as well as to display the same picture on the bidirectional screens, and a driving apparatus thereof.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, there is provided an organic EL device comprising: a first organic EL panel for a unidirectional display; and a second organic EL panel for a unidirectional display, each of the first and second organic EL panels having a substrate, a first electrode, an emitting layer and a second electrode, wherein the first organic EL panel and the second organic EL panel are coupled so as to display pictures in bidirections.

The first organic EL panel and the second organic EL panel may be coupled using a UV hardening material.

The above organic EL device may further comprise a buffer layer for electrical contact of the first organic EL panel and the second organic EL panel.

The above organic EL device may further comprise an insulating layer for electrical isolation between the first organic EL panel and the second organic EL panel.

Also, the first organic EL panel and the second organic EL panel can be selectively driven to display the same picture or different pictures.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE INVENTION

Reference will now be made in detail to the preferred embodiments of the present invention, examples of which are illustrated in the accompanying drawings.

First Embodiment

Figure 1:
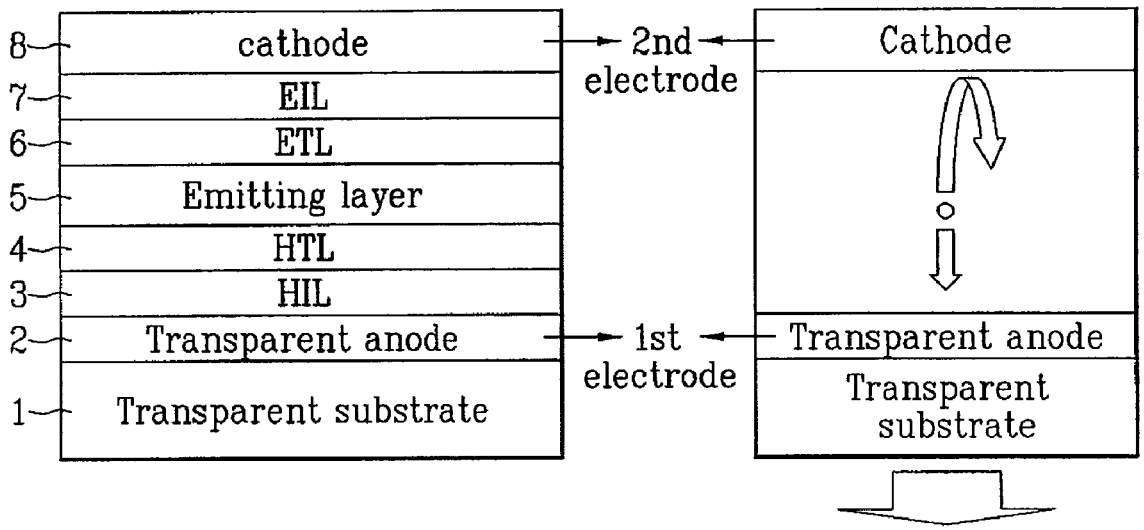
FIG. 1 is a sectional view of a bottom emission type organic EL device according to the related art.
Figure 2:
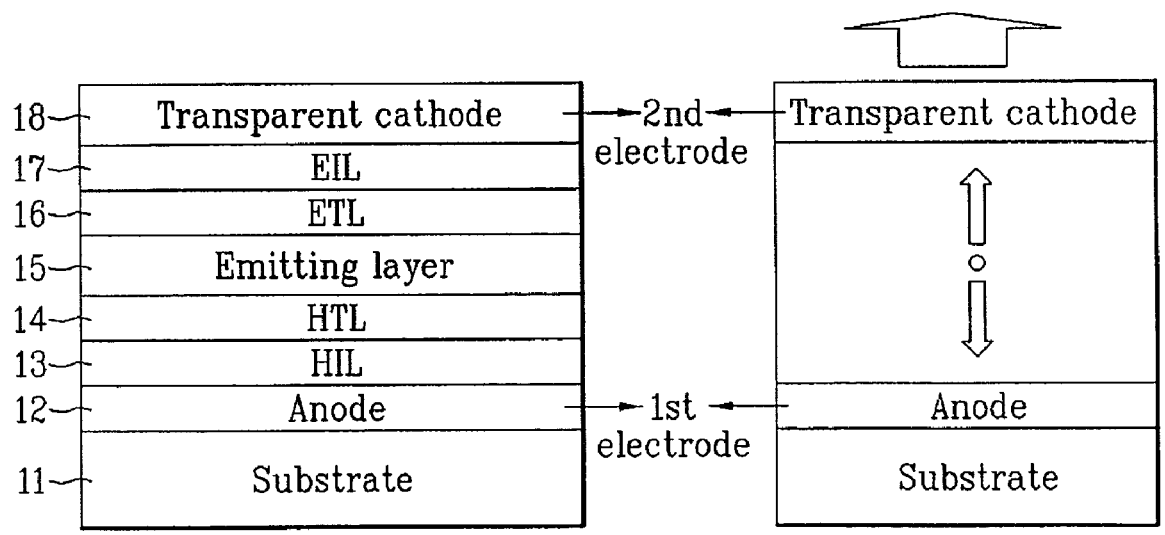
FIG. 2 is a sectional view of a top emission type organic EL device according to the related art.
Figure 3:
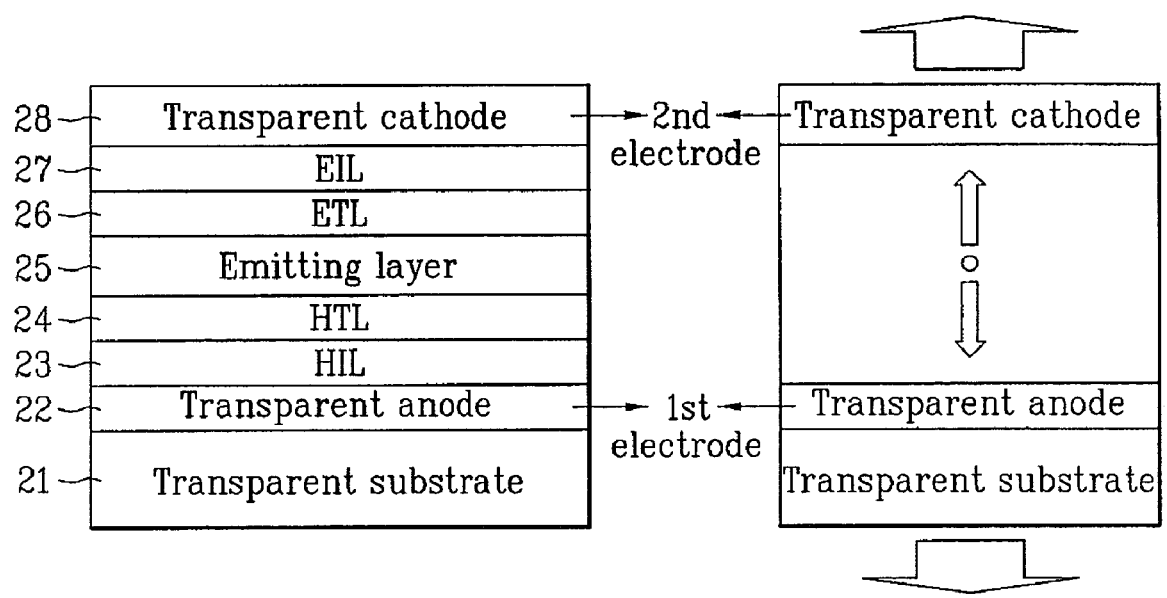
FIG. 3 is a sectional view of an organic EL device for bidirectional display according to the related art.
Figure 4:
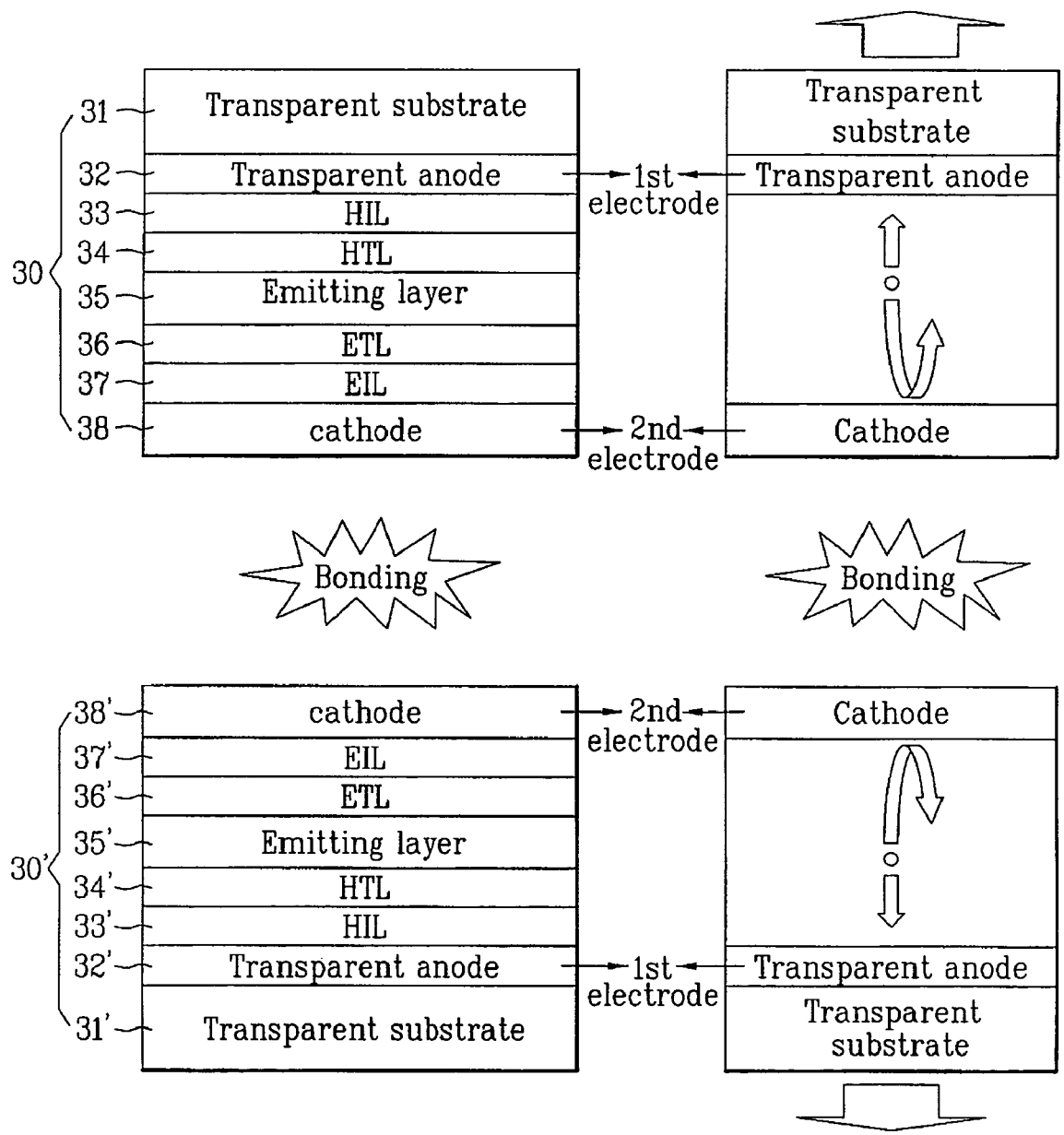
FIG. 4 is a sectional view of an organic EL device for bidirectional display according to a first embodiment of the present invention.

As shown in FIG. 4, an organic EL device for bidirectional display according to a first embodiment of the present invention is made by bonding a first organic EL panel 30 and a second organic EL panel 30'.

The first organic EL panel 30 performs a unidirectional display through a transparent anode 32 and a transparent substrate 31, and the second organic EL panel 30' also performs a unidirectional display through a transparent anode 32' and a transparent substrate 31'.

Accordingly, the first organic EL panel 30 and the second organic EL panel 30' are coupled by bonding a cathode 38 of the first organic EL panel 30 with a cathode 38' of the second organic EL panel 30' for bidirectional display.

Next, a method of fabricating the first and second organic EL panels 30 and 30' will be described.

Since the first organic EL panel 30 and the second organic EL panel 30' have the same structure of which upper and lower sides are inverted, their description is made centering on the first organic EL panel 30.

A transparent anode 32 is formed on a transparent substrate 31. The transparent anode 32 is generally made of indium tin oxide (ITO).

Figure 8:
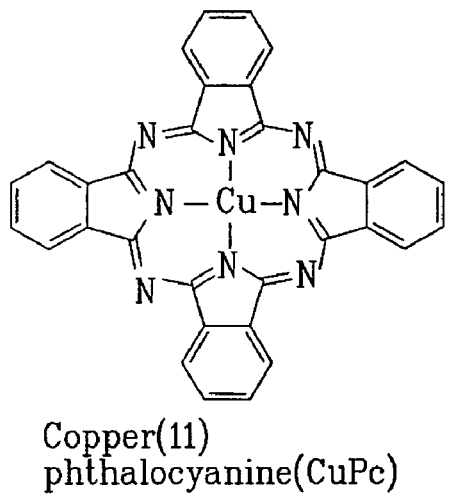
FIG. 8 shows molecular structural formulas of CuPC, TPD, Alq3, NPD and phthalocyanine.
Figure 8:
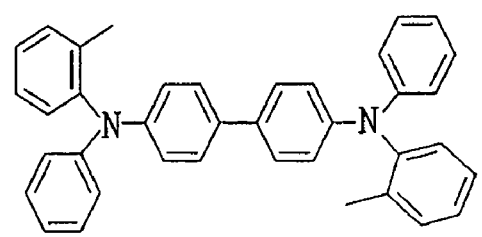
Figure 8:
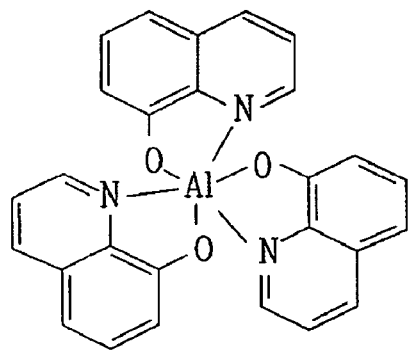
Figure 8:
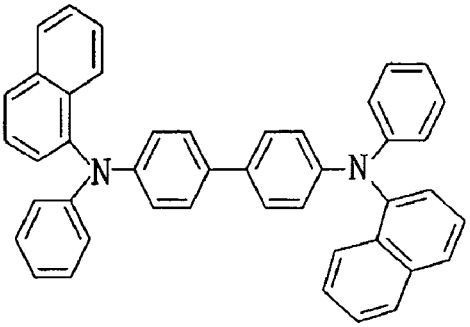

Next, a hole injecting layer (HIL) 33 is formed on the transparent anode 32. The HIL 33 is generally made of copper phthalocyanine (CuPc) and is coated to a thickness of 10-30 nm. The structure of CuPc is shown in FIG. 8 for your understanding.

Next, a hole transport layer (HTL) 34 is formed on the HIL 33.

The HTL 33 is generally made of TPD (N'-diphenyl-N,N'-bis(3-methylphenyl)-(1-1'-biphenyl)4,4'-diamine) or NPD (4,4'-bis[N-(1-naphthyl)-N-phenyl-amino]biphenyl), and is deposited to a thickness of 30-60 nm. The structures of TPD and NPD are shown in FIG. 8 for your understanding.

Next, an organic emitting layer 35 made of an organic material is formed on the HTL 34.

The organic emitting layer 35 as formed may contain dopants if necessary.

In case of green light emission, $Alq_3$ {tris(8-hydroxyquinolate)aluminum} is deposited to about 30-60 nm so as to form the organic emitting layer 5, and coumarin 6 or Qd (Quinacridone) is added as the dopants.

In case of red light emission, ECM, DCJT, DCJTB or the like is used. The structure of $Alq_3$ is also shown in FIG. 8.

Next, an electron transport layer (ETL) 36 and an electron injecting layer (EIL) 37 are continuously formed on the organic emitting layer 35, or the ETL 36 and the EIL 37 are formed together with an electron injection transport layer.

At this time, the EIL 37 is formed by coating LiF or $Li_2O$ to a thickness of about 5□, or by depositing alkali metal or alkaline-earth metal such as Li, CA, Mg, Sm, etc. to a thickness less than 200□ for making electron injection better.

Also, in case of the green light emission, since Alq3 used as the organic emitting layer 5 has a good electron transport capability, the EIL 7 and the ETL 6 may be not used.

Next, aluminum (Al) is coated on the EIL 7 to a thickness of about 1000□ to form a cathode 38, thereby completing the first organic EL panel 30.

The second organic EL panel 30' is fabricated by the same method as the aforementioned method.

The cathode 38 of the first organic EL panel 30 is bonded with the cathode 38' of the second organic EL panel 30', thereby completing the fabrication of the organic EL device for bidirectional display.

The bonding of the first and second organic EL panels 30 and 30' is performed using an ultra violet (UV) hardening material, for example, epoxy-based adhesive.

Although not shown in the drawings, a buffer layer for electrical connection of the two EL panels may be further formed between the first organic EL panel 30 and the second organic EL panel 30'.

Also, although not shown in the drawings, an insulating layer for electrical insulation between the two EL panels may be further formed between the first organic EL panel 30 and the second organic EL panel 30'.

Alternatively, any one of the cathodes of the first and second organic EL panels 30 and 30' may be commonly used.

In other words, any one of the first and second organic EL panels 30 and 30' may not have the cathode.

According to the above first embodiment, since the respective emitting layers are provided to display pictures through the transparent anode and the transparent substrate, a sufficient brightness for bidirectional display is obtained, so that a low power operation becomes possible.

Also, since the opaque cathode is used, performance and transmittance are enhanced compared with the related art EL device using the transparent cathode.

This is because the transparent cathode formed by a sputtering causes a thermal stress to lower the device performance and a transparent passivation layer is further required on the transparent cathode, thereby causing drop of the overall transmittance.

Second Embodiment

Figure 5:
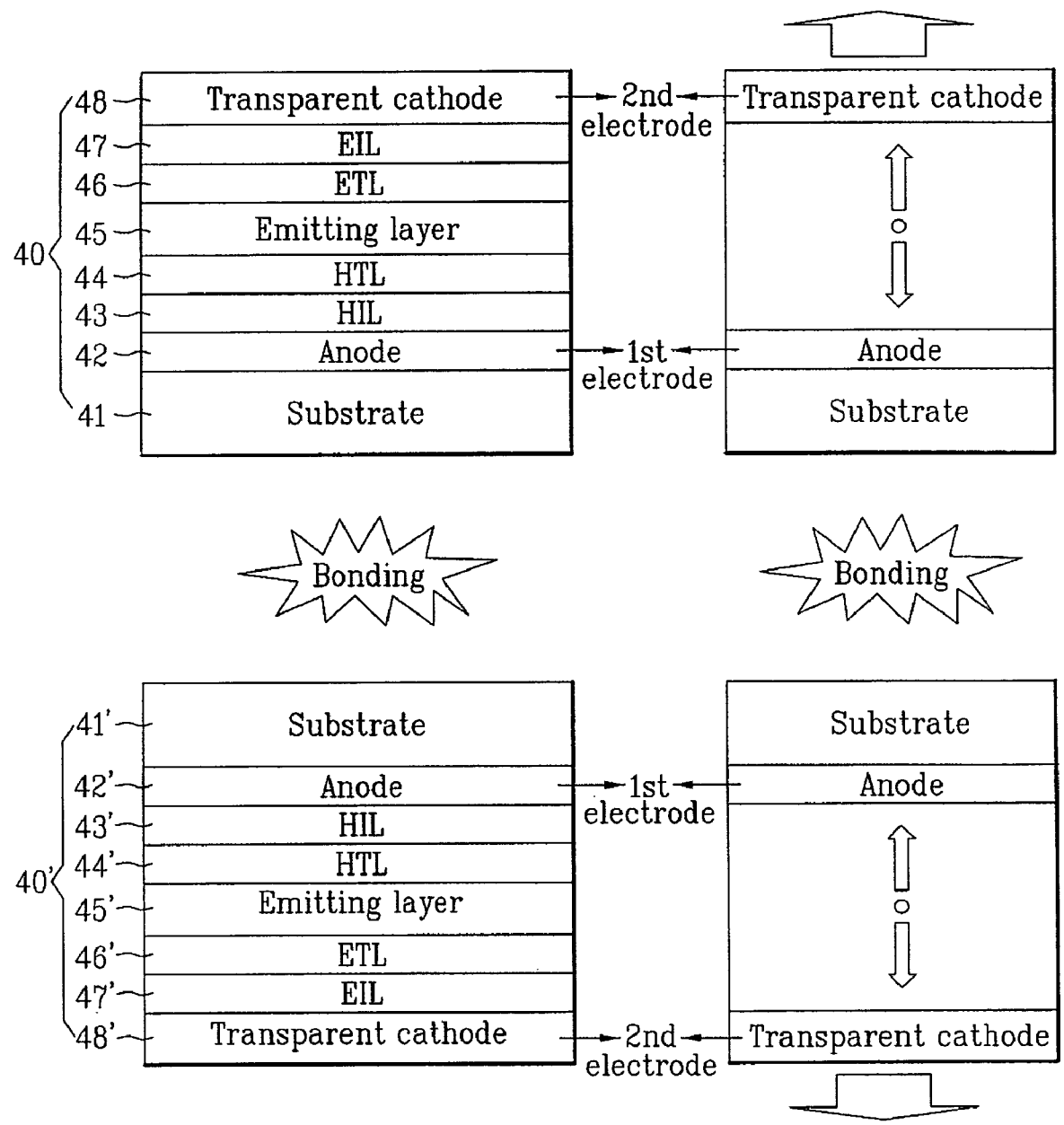
FIG. 5 is a sectional view of an organic EL device for bidirectional display according to a second embodiment of the present invention.

As shown in FIG. 5, an organic EL device for bidirectional display according to a second embodiment of the present invention is made by bonding a first organic EL panel 40 and a second organic EL panel 40'.

The first and second organic EL panels 40 and 40' perform a unidirectional display through their respective transparent cathodes 48 and 48'.

Accordingly, the first organic EL panel 40 and the second organic EL panel 40' are coupled by bonding the transparent cathode 48 of the first organic EL panel 40 and the transparent cathode 48' of the second organic EL panel 40' for bidirectional display.

Next, a method of fabricating the first and second organic EL panels 40 and 40' will be described.

Since the first organic EL panel 40 and the second organic EL panel 40' have the same structure of which upper and lower sides are inverted, their description is made centering on the first organic EL panel 40.

First, an anode 42 is formed on an opaque substrate 41.

Next, a hole injecting layer (HIL) 43 and a hole transport layer (HTL) 44 are formed on the anode 42.

Next, an organic emitting layer 45 made of an organic material is formed on the HTL 44.

Next, an electron transport layer (ETL) 46 and an electron injecting layer (EIL) 47 are formed on the organic emitting layer 45.

Next, a transparent cathode 48 is formed on the EIL 47 such that light emits, thereby completing the first organic EL panel 40.

The second organic EL panel 40' is fabricated by the same method as the aforementioned method.

The substrate 41 of the first organic EL panel 40 is bonded with the substrate 41' of the second organic EL panel 40', thereby completing the fabrication of the organic EL device for bidirectional display.

The bonding of the first and second organic EL panels 40 and 40' is performed using an ultra violet (UV) hardening material, for example, epoxy-based adhesive.

Although not shown in the drawings, a buffer layer for electrical connection of the two EL panels may be further formed between the first organic EL panel 40 and the second organic EL panel 40'.

Also, although not shown in the drawings, an insulating layer for electrical insulation between the two EL panels may be further formed between the first organic EL panel 40 and the second organic EL panel 40'.

Alternatively, any one of the substrates of the first and second organic EL panels 40 and 40' may be commonly used.

In other words, after the first organic EL panel 40 is fabricated, the second organic EL panels 40' except for the substrate 41' is formed on an exposed surface of the substrate 41 of the first organic EL panel 40.

Of course, the reverse case will be also possible.

According to the above second embodiment, since the respective emitting layers are provided to display pictures through the transparent cathodes, a sufficient brightness for bidirectional display is obtained, so that a low power operation becomes possible.

Third Embodiment

Figure 6:
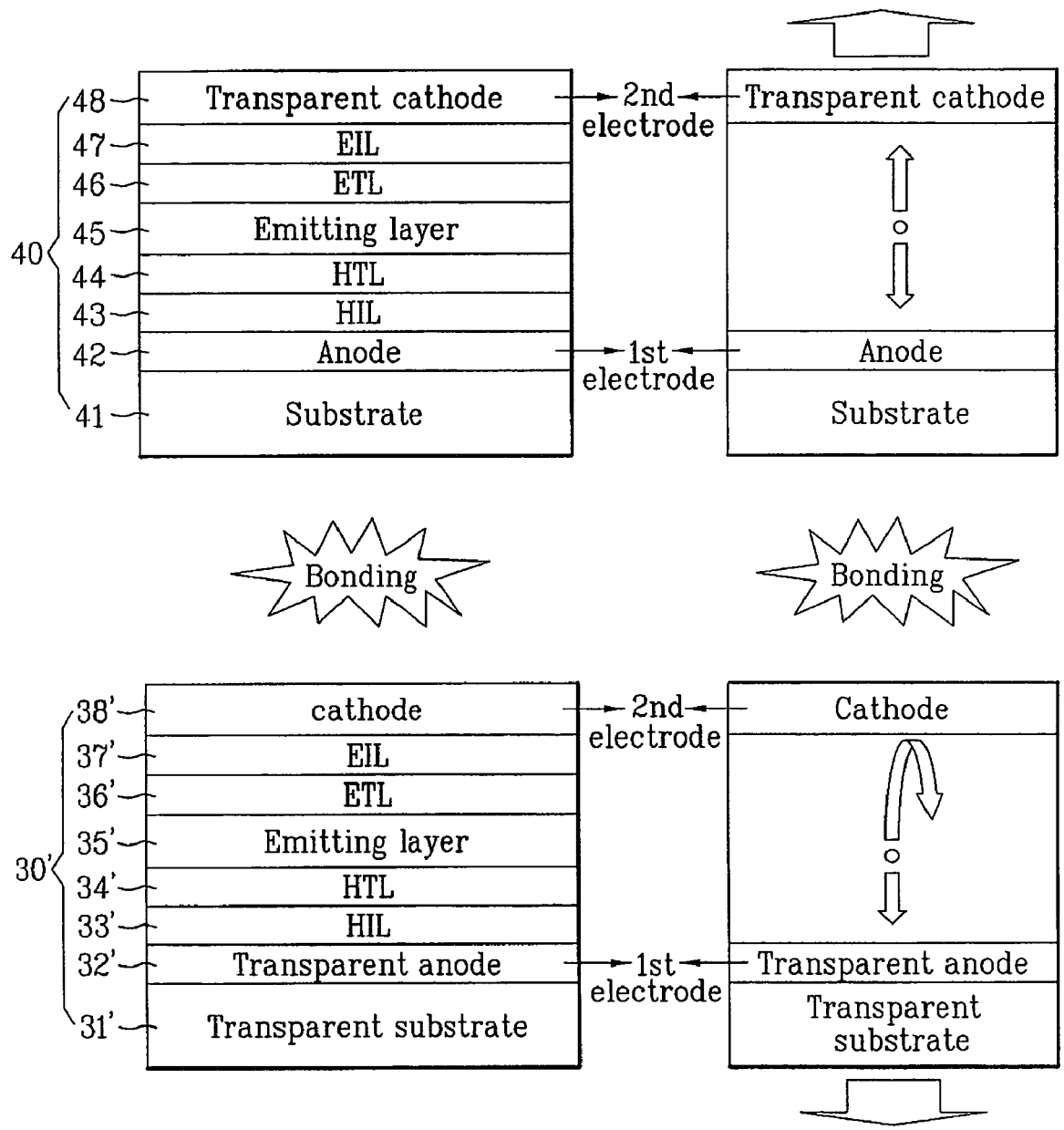
FIG. 6 is a sectional view of an organic EL device for bidirectional display according to a third embodiment of the present invention.

As shown in FIG. 6, an organic EL device for bidirectional display according to a third embodiment of the present invention is made by bonding a first organic EL panel 40 and a second organic EL panel 30'.

The first organic EL panel 40 performs a unidirectional display through a transparent cathode 48 and has the same structure as the first organic EL panel 40 of FIG. 5.

The second organic EL panel 30' performs a unidirectional display through a transparent anode 32' and a transparent substrate 31' and has the same structure as the second organic EL panel 30' of FIG. 4.

Accordingly, the first organic EL panel 40 and the second organic EL panel 30' are coupled by bonding the substrate 41 of the first organic EL panel 40 and the cathode 38' of the second organic EL panel 30' for bidirectional display.

Since a method of fabricating the first and second organic EL panels 40 and 30' was described in the first and second embodiments, their repeated description will be omitted.

The bonding of the first and second organic EL panels 40 and 30' is performed using an ultra violet (UV) hardening material, for example, epoxy-based adhesive.

Although not shown in the drawings, a buffer layer for electrical connection of the two EL panels may be further formed between the first organic EL panel 40 and the second organic EL panel 30'.

Also, although not shown in the drawings, an insulating layer for electrical insulation between the two EL panels may be further formed between the first organic EL panel 40 and the second organic EL panel 30'.

According to the above third embodiment, since the respective emitting layers are provided to display pictures through the transparent cathode and the transparent substrate, a sufficient brightness for bidirectional display is obtained, so that a low power operation becomes possible.

Fourth Embodiment

Figure 7:
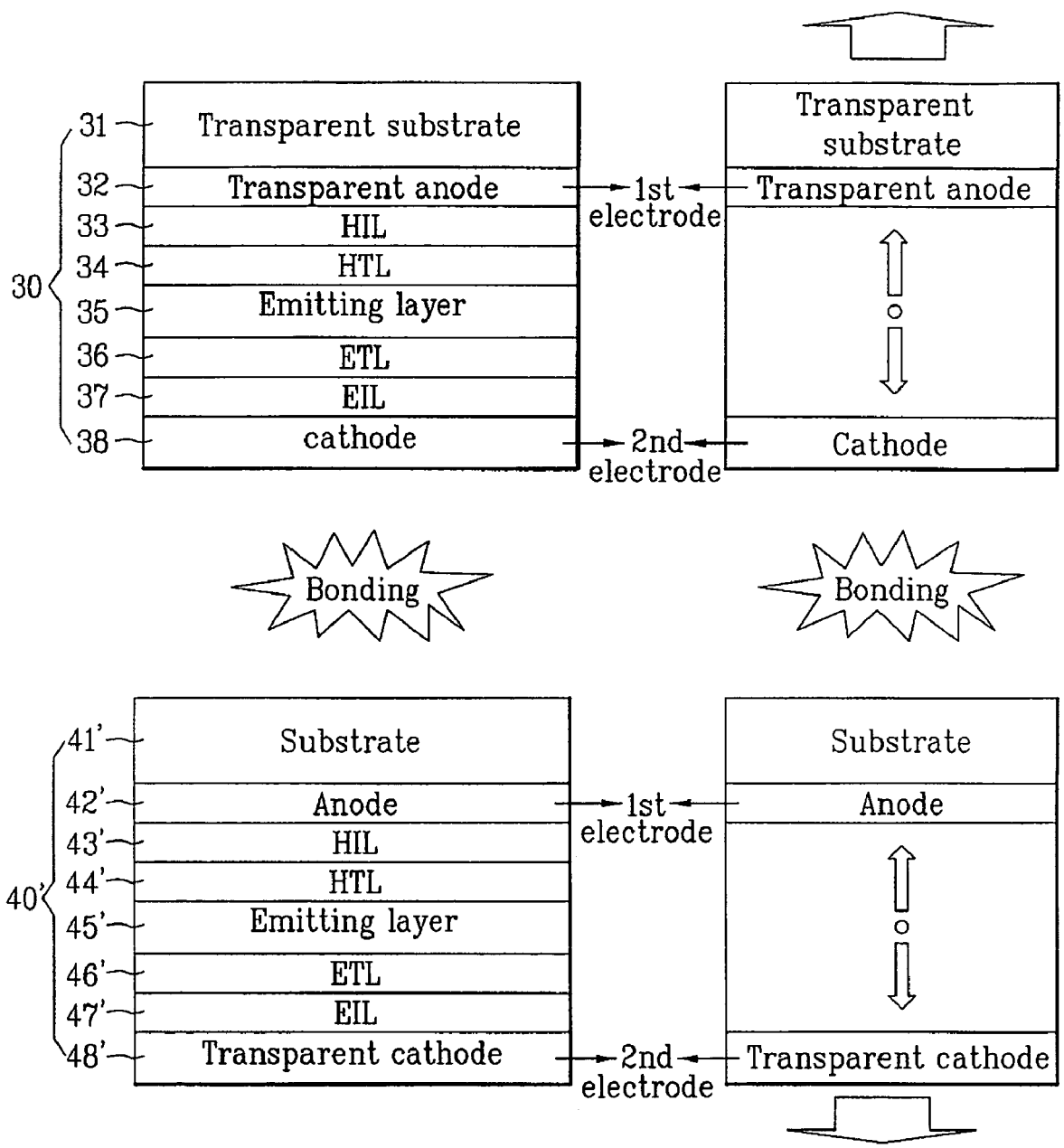
FIG. 7 is a sectional view of an organic EL device for bidirectional display according to a fourth embodiment of the present invention.

As shown in FIG. 7, an organic EL device for bidirectional display according to a fourth embodiment of the present invention is made by bonding a first organic EL panel 30 and a second organic EL panel 40'.

The first organic EL panel 30 performs a unidirectional display through a transparent anode 32 and a transparent substrate 31, and has the same structure as the first organic EL panel 30 of FIG. 4.

The second organic EL panel 40' performs a unidirectional display through a transparent cathode 48' and has the same structure as the second organic EL panel 40' of FIG. 5.

Accordingly, the first organic EL panel 30 and the second organic EL panel 40' are coupled by bonding the cathode 38 of the first organic EL panel 30 and the substrate 40' of the second organic EL panel 40' for bidirectional display.

Since a method of fabricating the first and second organic EL panels 30 and 40' was described in the first and second embodiments, their repeated description will be omitted.

The bonding of the first and second organic EL panels 30 and 40' is performed using an ultra violet (UV) hardening material, for example, epoxy-based adhesive.

Although not shown in the drawings, a buffer layer for electrical connection of the two EL panels may be further formed between the first organic EL panel 30 and the second organic EL panel 40'.

Also, although not shown in the drawings, an insulating layer for electrical insulation between the two EL panels may be further formed between the first organic EL panel 30 and the second organic EL panel 40'.

According to the above fourth embodiment, since the respective emitting layers are provided to display pictures through the transparent cathode and the transparent substrate, a sufficient brightness for bidirectional display is obtained, so that a low power operation becomes possible.

Hereinafter, construction and operation of a driving apparatus of an organic EL device according to a preferred embodiment of the present invention will be described with reference to the accompanying drawings.

Figure 9:
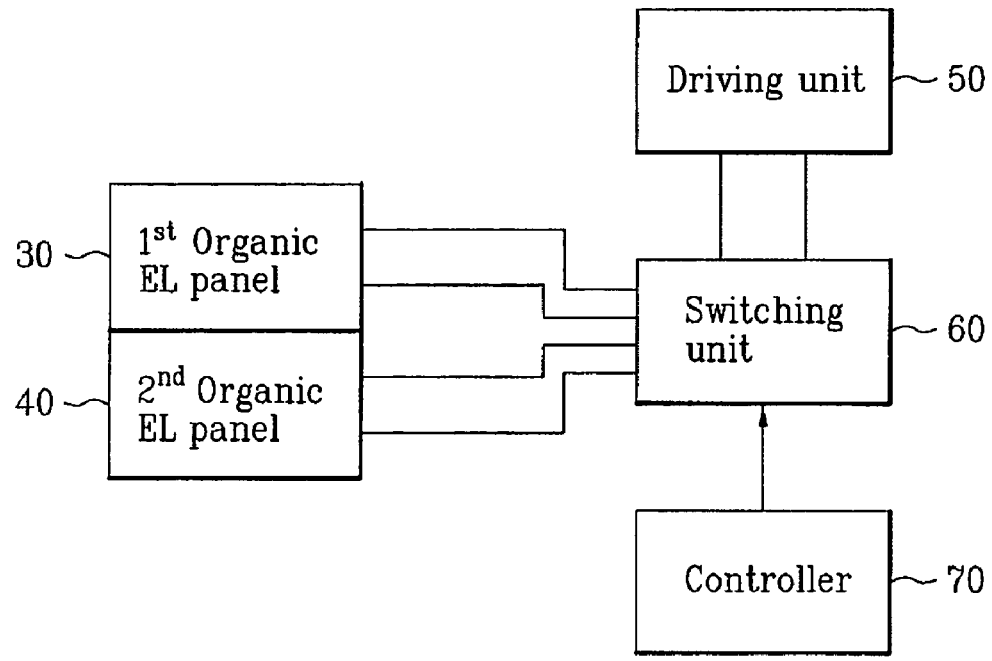
FIG. 9 is a block diagram of a driving apparatus of an organic EL device according to the present invention.

As shown in FIG. 9, a driving apparatus of an organic EL device includes an organic EL device, a driving unit 50, a switching unit 60 and a controller 70.

The driving apparatus of the present invention may be used in all organic EL devices each having first and second electrodes and operatable separately as well as in the organic EL devices fabricated according to the first to fourth embodiments of the present invention.

The driving unit 50 outputs first and second driving signals such that the organic EL device can display pictures.

The driving unit 50 may be constructed to output only one driving signal or two or more driving signals.

The switching unit 60 supplies at least one of the first and second organic EL panels with the first and second driving signals outputted from the driving unit 50 according to a control signal.

Figure 10:
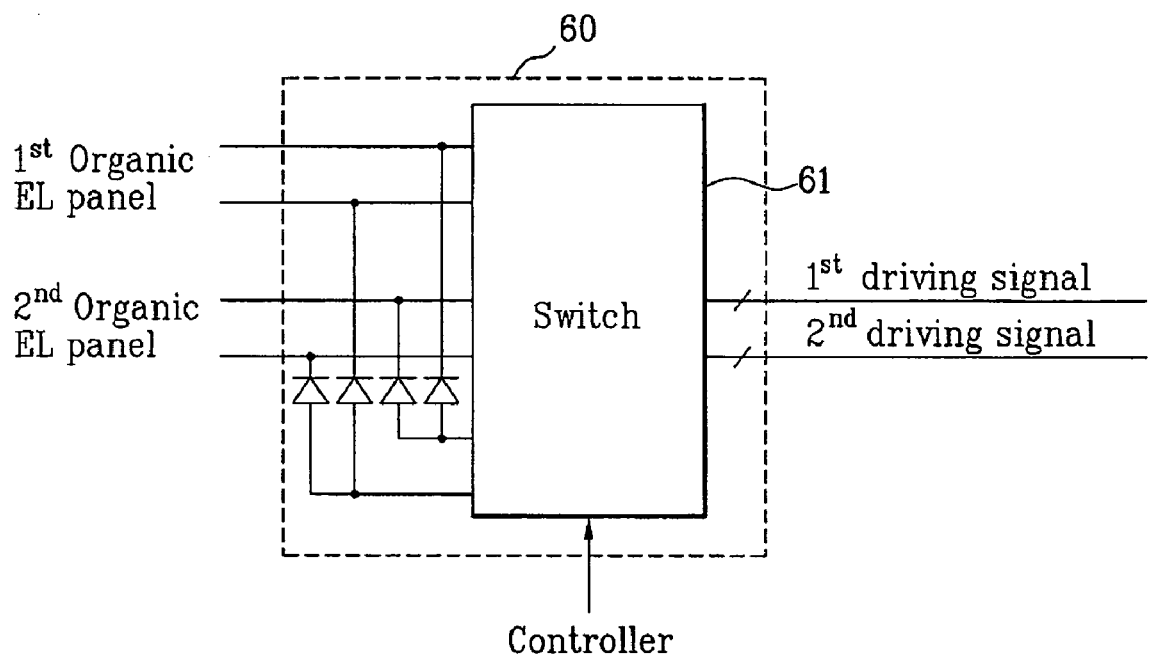
FIG. 10 is a block diagram of the switching unit of FIG. 9.

At this time, the switching unit 60, as shown in FIG. 10, includes first and second input terminals receiving the first and second driving signals outputted from the driving unit 50, a first output terminal outputting one of the first and second driving signals to the first organic EL panel, a second output terminal outputting one of the first and second driving signals to the second organic EL panel, a third output terminal concurrently outputting one of the first and second driving signals to the first organic EL panel and the second organic EL panel, a switch 61 selectively connecting the first and second input terminals with the first to third output terminals, and a diode connected to the third output terminal, for preventing a signal transmission error between the first output terminal and the second output terminal.

Alternatively, the switching unit 60 may be designed having a different construction depending on the number of the signals outputted from the driving unit 50.

The controller 70 controls the switching unit 60 according to a preset program or an external control.

In the above, the preset program is to automatically perform a picture display. For example, there are the same picture display setting in bidirections, a different picture display setting in bidirections, or a unidirectional picture display setting.

Also, the external control means a control signal of when a user manually selects one of the picture display settings.

The operation of the driving apparatus of the organic EL device constructed as above will now be described.

The organic EL device can display different pictures with respect to the first and second organic EL panels as well as perform bidirectional display.

Accordingly, a display operation of the same picture in bidirections, a display operation of different pictures setting in bidirections, or a display of a picture in a single direction will be described with the driving apparatus.

First, when a display of the same picture in bidirections is set, the controller 70 controls the switch 61 shown in FIG. 10 such that the first driving signal (or second driving signal) is supplied to the first organic EL panel and the second organic EL panel at the same time.

Accordingly, the first and second organic EL panels operate according to the first driving signal to display the same picture.

Next, when a display of different pictures in bidirections is set, the controller 70 controls the switch 61 shown in FIG. 10 such that the first driving signal (or second driving signal) is supplied to the first organic EL panel through the first output terminal.

Concurrently with this, the controller 70 controls the switch 61 such that the second driving signal (or first driving signal) is supplied to the second organic EL panel through the second output terminal.

Accordingly, the first and second organic EL panels operate according to the first driving signal and the second driving signal to display the respective different pictures thereon.

Next, when a display of a picture in a single direction, for example, a display of a picture on the first organic EL panel according to the first driving signal, is set, the controller 70 controls the switch 61 shown in FIG. 10 such that the first driving signal is supplied to the first organic EL panel through the first output terminal.

Accordingly, the first organic EL panel operates according to the first driving signal to display a picture thereon. At this time, the second organic EL panel does not display a picture.

In other words, a selected picture is displayed on a selected panel but a picture is not displayed on a non-selected panel.

It will be apparent to those skilled in the art that various modifications and variations can be made in the present invention. Thus, it is intended that the present invention covers the modifications and variations of this invention provided they come within the scope of the appended claims and their equivalents.

What is claimed is:

1. An organic EL device for bidirectional display, comprising:
   a first organic EL panel having a first substrate, a first anode on the first substrate, a first emitting layer on the first anode, and a first transparent cathode on the first emitting layer;
   a second organic EL panel having a second substrate, a second anode on the second subsrate, a second emitting layer on the second anode, and a second transparent cathode on the second emitting layer; and
   a layer formed between the first substrate and the second substrate, wherein the first substrate is electrically insulated and directly bonded from/to the second substrate by the layer and wherein the layer is formed on an entire surface of the first substrate and the second substrate, wherein the layer is an ultra violet (UV) hardening material having electric insulation and adhesive properties.

2. An organic EL device for bidirectional display, comprising:
- a first organic EL panel having a substrate, an anode on the substrate, a first emitting layer on the anode, and a transparent cathode on the first emitting layer;
- a second organic EL panel having a transparent substrate, a transparent anode on the transparent substrate, a second emitting layer on the transparent anode and a cathode on the second emitting layer; and
- a layer formed between the substrate of the first organic EL panel and the cathode of the second organic EL panel, wherein the substrate of the first organic EL panel is electrically insulated and directly bonded from/to the cathode of the second organic EL panel by the layer and wherein the layer is formed on an entire surface of the substrate and the cathode, wherein the layer is an ultra violet (UV) hardening material having electric insulation and adhesive properties.

3. An organic EL device for bidirectional display, comprising:
- a first organic EL panel having a transparent substrate, a transparent anode on the transparent substrate, a first emitting layer on the transparent anode and a cathode on the first emitting layer;
- a second organic EL panel having a substrate, an anode on the substrate, a second emitting layer on the anode, and a transparent cathode on the second emitting layer; and
- a layer formed between the cathode of the first organic EL panel and the substrate of the second organic EL panel, wherein the cathode of the first organic EL panel is electrically insulated and directly bonded from/to the substrate of the second organic EL panel by the layer and wherein the layer is formed on an entire surface of the substrate and the cathode, wherein the layer is an ultra violet (UV) material having electric insulation and adhesive properties.

* * * * *